United States Patent
Kuroda et al.

(10) Patent No.: US 7,527,501 B2
(45) Date of Patent: May 5, 2009

(54) COAXIAL CONNECTOR, CONNECTOR ASSEMBLY, PRINTED CIRCUIT BOARD AND ELECTRONIC APPARATUS

(75) Inventors: Yasuhide Kuroda, Kawasaki (JP); Takatoshi Yagisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 51 days.

(21) Appl. No.: 11/525,902

(22) Filed: Sep. 25, 2006

(65) Prior Publication Data

US 2007/0264872 A1 Nov. 15, 2007

(30) Foreign Application Priority Data

May 15, 2006 (JP) ............... 2006-135043

(51) Int. Cl.
*H01R 12/00* (2006.01)
(52) U.S. Cl. ........................... 439/63; 439/581
(58) Field of Classification Search ............ 439/63, 439/581
See application file for complete search history.

(56) References Cited

U.S. PATENT DOCUMENTS

| | | | | |
|---|---|---|---|---|
| 5,404,117 A * | 4/1995 | Walz | ............... | 333/34 |
| 5,532,659 A * | 7/1996 | Dodart | ............... | 333/260 |
| 5,897,384 A * | 4/1999 | Hosler, Sr. | ............... | 439/63 |
| 6,065,976 A * | 5/2000 | Wang | ............... | 439/63 |
| 6,106,304 A * | 8/2000 | Huang | ............... | 439/63 |
| 6,457,979 B1 * | 10/2002 | Dove et al. | ............... | 439/63 |
| 6,682,354 B2 * | 1/2004 | Carson et al. | ............... | 439/63 |
| 6,811,405 B1 * | 11/2004 | Huang | ............... | 439/63 |
| 7,008,265 B2 * | 3/2006 | Jonsson et al. | ............... | 439/581 |
| 7,048,547 B2 * | 5/2006 | Gottwald | ............... | 439/63 |

FOREIGN PATENT DOCUMENTS

| | | |
|---|---|---|
| JP | 5-235613 | 9/1993 |
| JP | 2000-182689 | 6/2000 |
| JP | 2003-123882 | 4/2003 |
| JP | 2006-12717 | 1/2006 |

\* cited by examiner

*Primary Examiner*—Gary F. Paumen
(74) *Attorney, Agent, or Firm*—Staas & Halsey LLP

(57) ABSTRACT

A coaxial connector is configured to be connected to a flexible printed circuit board on which a signal line is formed. An inner conductor is configured to be connected to the signal line. An outer conductor surrounds the inner conductor and serves as a connector body. At least one slit is provided to the outer conductor so that a portion of the flexible printed circuit board is inserted therein.

10 Claims, 14 Drawing Sheets

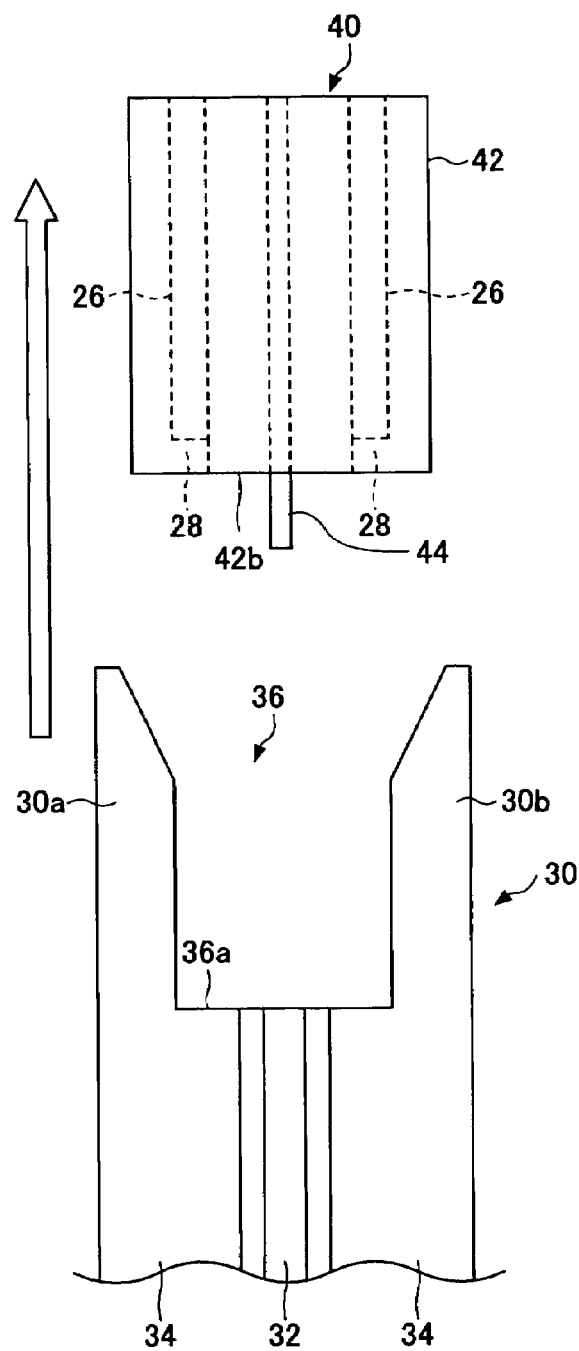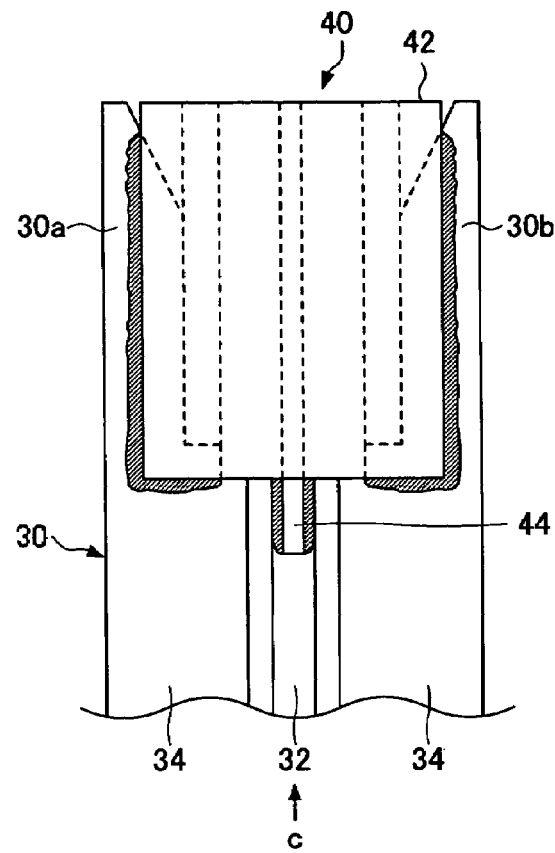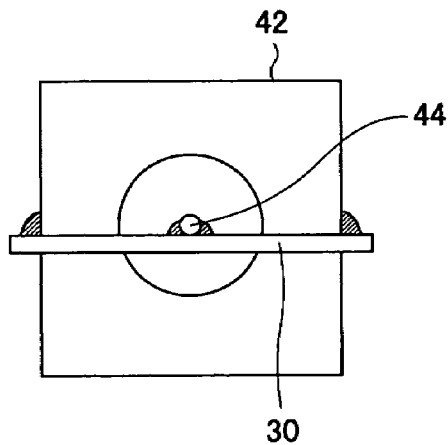

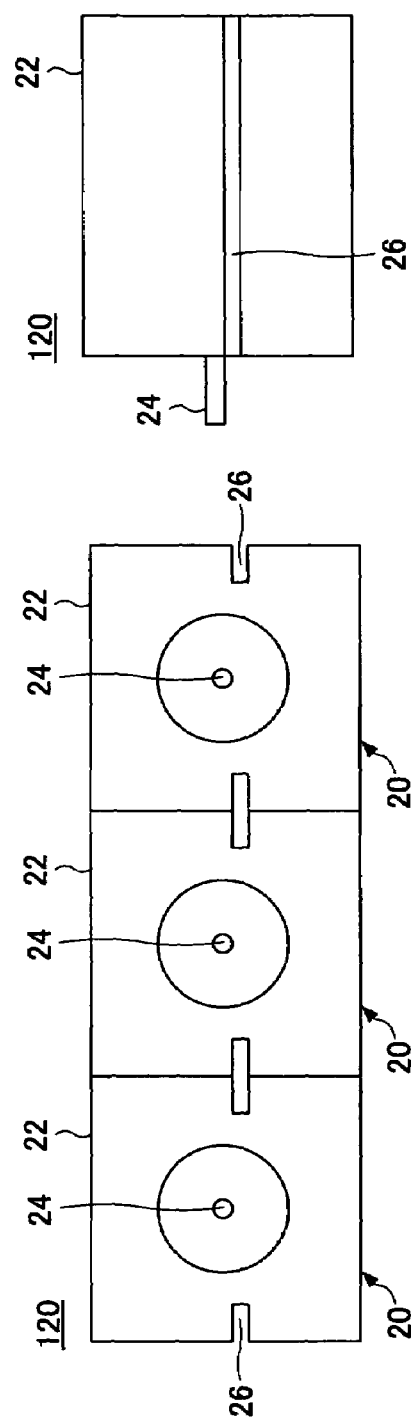
FIG.13C
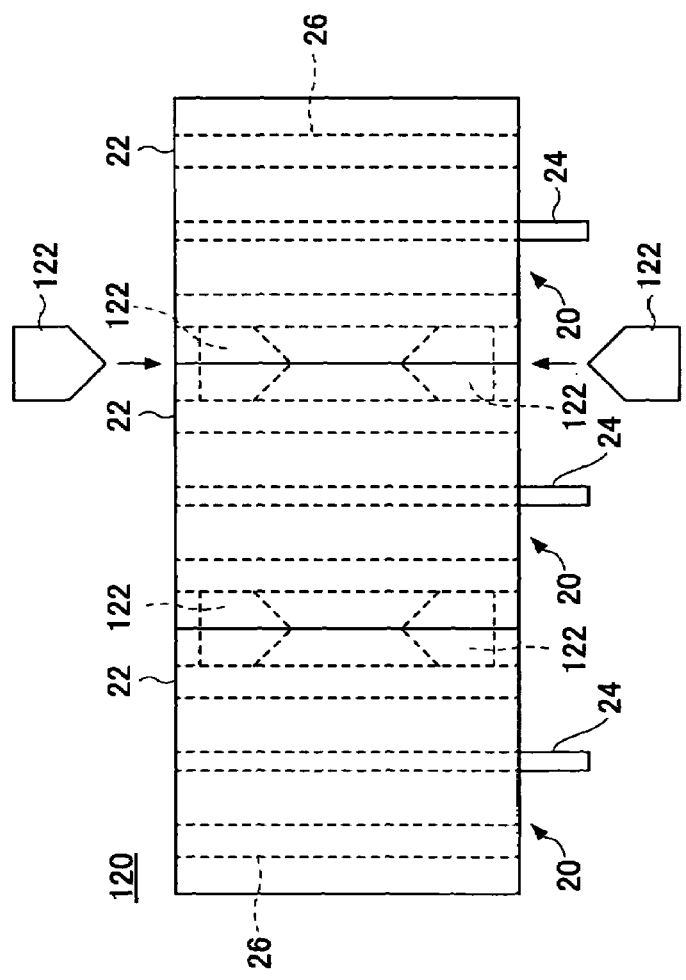
FIG.13A
FIG.13B

COAXIAL CONNECTOR, CONNECTOR ASSEMBLY, PRINTED CIRCUIT BOARD AND ELECTRONIC APPARATUS

BACKGROUND OF THE INVENTION

1. Field of the Invention

The present invention generally relates to coaxial connectors and, more particularly, to a coaxial connector used for connection between circuit boards in a high-speed optical module or a radio module, and a connector assembly, a printed circuit board and an electronic apparatus having such a coaxial connector.

2. Description of the Related Art

For example, in an optical transceiver module, which processes a several 10 GHz high-speed signal, a coaxial cable is used as a transmission line, which connects between circuit boards or between devices. The coaxial cable has advantages in that it has a small dielectric loss with respect to a signal, it has a certain degree of flexibility and it can be easily handled. Accordingly, when connecting one circuit board to another circuit board by a transmission line, even if connecting portions of the circuit boards are not arranged along a straight line, they can be connected by a coaxial cable being bent in a necessary form.

The coaxial cable has a three-dimensional structure in which an inner conductor is surrounded by an outer conductor. On the other hand, a transmission path on a circuit board has a planer structure in which outer conductors are arranged on both sides of an inner conductor, or a so-called micro-strip structure in which an inner conductor and an outer conductor are arranged on front and back surfaces of an insulating film, respectively. Thus, a coaxial connecter for connecting a coaxial cable and a transmission line on a circuit board is configured to convert the three-dimensional structure of the coaxial cable into the planer structure of the circuit board.

As a coaxial connector attached to end portion of a circuit board, there are a screw-shaped connector (for example, SMA, V, etc.) and a push-on connector (for example, SMP, GPPO, etc.). Additionally, there is suggested a connector structure for converting into a micro-strip line path, in which a signal line formed on a surface of a board faces an inner conductor of a coaxial line path and a grounding line formed on a back surface of the board faces an outer conductor (for example, refer to Patent Document 1).

Patent Document 1: Japanese Laid-Open Patent Application No. 5-235613

In recent years, miniaturization of optical transceiver modules and microwave transmission apparatuses has progressed, and there is a demand for high-density mounting in those apparatuses. Although a coaxial cable has a certain degree of flexibility, an allowable bending radius of the coaxial cable is about several 10 mm, and it cannot be bent at a smaller bending radius. For example, if a coaxial cable is bent in a bending radius of several 10 mm or less, there is a possibility that a distortion occurs in an outer conductor, which may degrade a frequency characteristic of the coaxial cable. In a worst case, the outer conductor may be folded down and contacts the inner conductor.

Therefore, even if an attempt is made to increase packaging density by arranging the circuit boards and devices close to each other, it is necessary to provide a certain distance between circuit boards and between devices so as to acquire an allowable bending radius of a coaxial cable. Moreover, it is necessary to arrange the circuit boards and devices so that a bending radius of a line along which a coaxial cable is extended becomes large, which results in the coaxial cable being disincentive when an attempt is made to improve the packaging density of circuit boards and devices.

It is considered that the connectors of the circuit boards or the devices are connected directly without using a coaxial cable. However, in such a case, if one of the circuit boards or devices is fixed, the connector of the other circuit board or device must be moved in a radial direction, which requires a structure in which the connector is movable. Additionally, if both circuit boards or devices are directly connected by connectors and both circuit boards or devices are fixed, and when a stress is generated in the connecting portions (connectors) due to a temperature fluctuation, such a stress cannot be relaxed and there may be a fluctuation in the connecting portion characteristic due to the temperature fluctuation.

SUMMARY OF THE INVENTION

It is a general object of the present invention to provide a novel and useful coaxial connector in which the above-mentioned problems are eliminated.

A more specific object of the present invention is to provide a coaxial connector which is easily attached to a flexible transmission line without using a coaxial cable and a connector assembly, a printed circuit board and an electronic apparatus having such a coaxial connector.

In order to achieve the above-mentioned objects, there is provided according to one aspect of the present invention a coaxial connector configured to be connected to a flexible printed circuit board on which a signal line is formed, the coaxial connector comprising: an inner conductor configured to be connected to the signal line; an outer conductor surrounding the inner conductor and serving as a connector body; and at least one slit provided to the outer conductor so that a portion of said flexible printed circuit board is inserted therein.

In the coaxial connector according to the above-mentioned invention, the slit may be provided to a side surface of said outer conductor. The slit may be provided to an end surface of the outer conductor from which the inner conductor extends. A width of the slit may be substantially equal to a thickness of the flexible printed circuit board.

There is provided according to another aspect of the present invention a coaxial connector configured to be connected to a flexible printed circuit board on which a signal line is formed, the coaxial connector comprising: an inner conductor configured to be connected to the signal line; an outer conductor surrounding the inner conductor and serving as a connector body; and two protruding parts protruding from an end surface of said outer conductor on a side from which said inner conductor extends.

In the coaxial connector according to the above-mentioned invention, a distance between each of the protruding parts and the inner conductor in a direction perpendicular to the end surface may be substantially equal to a thickness of the flexible printed circuit board. The two protruding parts may be pins attached to the end surface of the outer conductor.

Additionally, there is provided another aspect of the present invention a connector assembly comprising: the above-mentioned coaxial connector; and a flexible printed circuit board, wherein the flexible printed circuit board has a notch part on an end portion connected to the coaxial connector so that an edge of the notch part is inserted into the slit of the outer conductor of the coaxial connector so that the flexible printed circuit board and the coaxial connector are electrically connected to each other.

In the connector assembly according to the above-mentioned invention, opposite side portions of the notch part may be inserted into the slits formed on both side surfaces of the outer conductor, respectively, and the side portions may be electrically connected to the outer conductor. A tapered portion may be provided at an end of each of the opposite side portions of the notch part. A bottom portion of the notch part is inserted into the slit formed on an end surface of the outer conductor so that the flexible printed circuit board and the coaxial connector are electrically connected to each other.

Further, there is provided according to another aspect of the present invention a connector assembly comprising: the coaxial connector according to the above-mentioned invention; and a flexible printed circuit board, wherein an end portion of the flexible printed circuit board is inserted into each of the two protruding portions protruding from the outer conductor and the inner conductor of the coaxial connector so that the flexible printed circuit board and the coaxial connector are electrically connected to each other.

Additionally, there is provided according to another aspect of the present invention a printed circuit board comprising: a connector assembly according to the above-mentioned invention; and a circuit board connected with the flexible printed circuit board of the connector assembly.

Further, there is provided according to another aspect of the present invention an electronic apparatus comprising: a printed circuit board according to the above-mentioned invention.

According to the present invention, slits or protruding parts are provided to the connector body so as to hold the edge of the flexible printed board so that the connector body can be easily held by the flexible print board. Since the flexible print board can be bent easily by a smaller bending radius than a coaxial cable, a distance between devices or boards can be reduced, which improves packaging density of the device and boards.

Other objects features and advantages of the present invention will become more apparent from the following detailed description when read in conjunction with the accompanying drawings.

BRIEF DESCRIPTION OF THE DRAWINGS

FIG. 5A is a plan view of the coaxial connector shown in FIG. 4A and a flexible printed circuit board to which the coaxial connector is connected; FIG. 5B is a plan view of the coaxial connector and the flexible printed circuit board in a state where the coaxial connecter is connected to the flexible printed circuit board; FIG. 5C is a front view of the coaxial connector in the state shown in FIG. 5B;

FIG. 13A is a plan view of a multi-conductor coaxial connector according to a fifth embodiment of the present invention; FIG. 13B is a front view of the multi-conductor coaxial connector shown in FIG. 13A; FIG. 13C is a side view of the multi-conductor coaxial connector shown in FIG. 13A;

DETAILED DESCRIPTION OF THE PREFERRED EMBODIMENTS

A description will now be given, with reference to the drawings, of embodiments according to the present invention.

According to one embodiment of the present invention, as a transmission line of signals, a coaxial cable is not used but a flat transmission line formed on a flexible printed circuit board is used. A flexible printed circuit board has more flexibility than a coaxial cable and has a smaller allowable bending radius. Therefore, by using a flexible printed circuit board, a transmission line can be bent by a smaller bending radius, and a freedom of arrangement of circuit boards and devices is increased and packaging density can be improved.

Here, when a flexible printed circuit board is used as a transmission line, it is necessary to attach a coaxial connector to a flexible printed circuit board. As a structure of attaching a coaxial connector to a flexible printed circuit board, there is considered a structure such as shown in FIG. 1.

Figure 1:
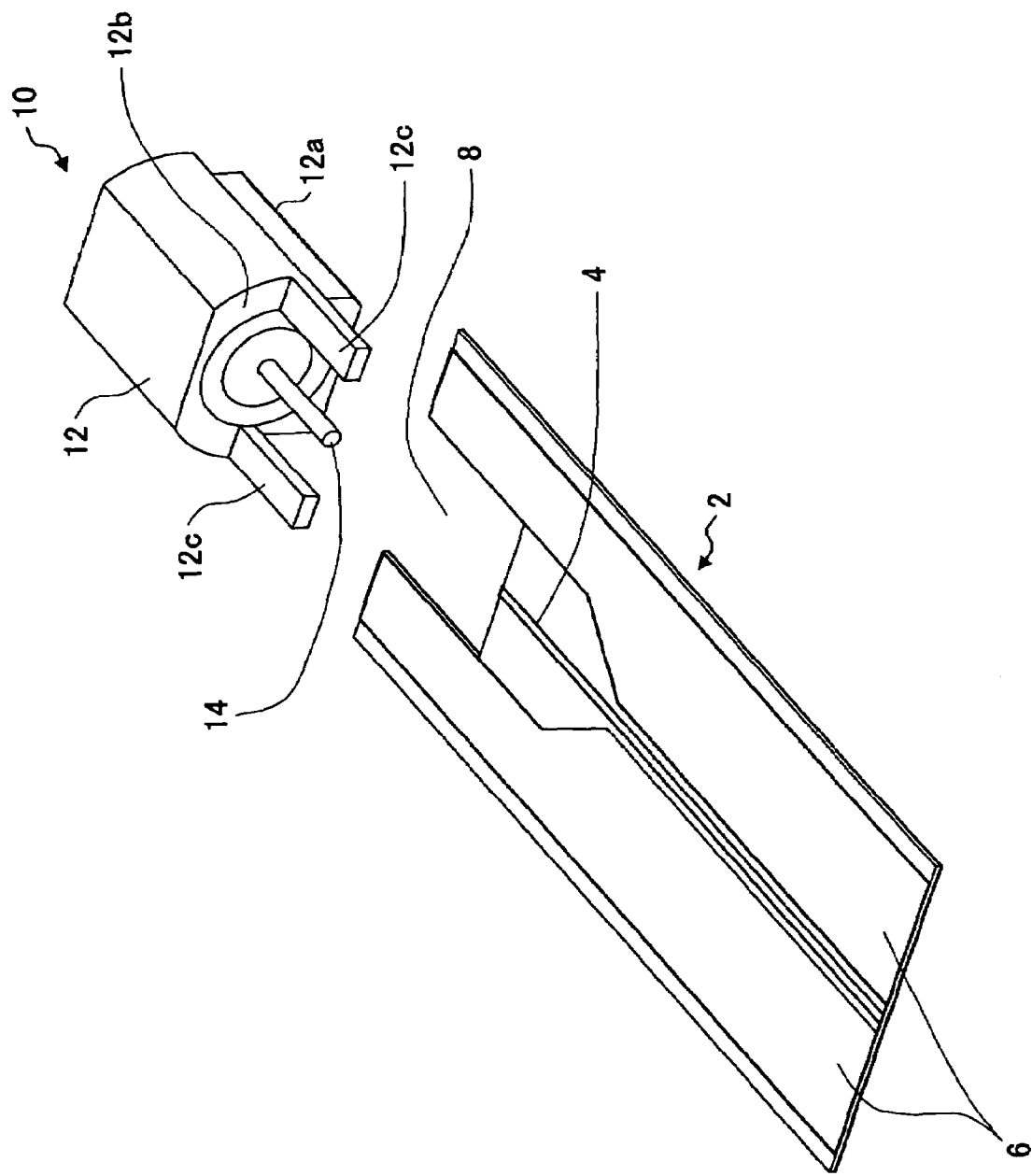
FIG. 1 is a perspective view of a coaxial connector and a flexible printed circuit board.

In FIG. 1, a signal line 4 for transmitting signals is formed on a surface of a flexible printed circuit board 2 (hereinafter, simply referred to as a film substrate 2), and power supply or grounding lines 6 is formed on both sides of the signal line 4. A notch part 8 is formed on an end portion of the film substrate 2. The signal line 4 extends to the notch part 8, and the power supply or grounding lines 6 extend on the sides of the notch part 8.

A coaxial connector 10 (hereinafter, simply referred to as a connector 10) comprises an outer conductor 12 having a hollow structure and serving as a connector body, and an inner conductor 14 extending through a centrum of the outer conductor 12. A fluorocarbon resin or the like may be filled in the centrum of the outer conductor 14 so that the inner conductor 14 extends in the center thereof. The outer conductor 12 and the inner conductor 14 are formed of, for example, a copper alloy, and preferably applied with nickel and gold plating on the surface thereof so as to facilitate solder joint.

A lower portion 12a of the outer conductor 12 is formed in almost the same width as the notch part 8 of the film substrate 2. Additionally, a pair of protruding parts 12c extend from an end surface of the outer conductor 12 so as to sandwich the inner conductor 14.

When connecting the connector 10 to the film substrate 2, the connector is placed on the film substrate 2 in a state where the lower portion 12a thereof is fitted in the notch part 8 of the film substrate 2. In this state, the inner conductor 14 is situated on the signal line 4 of the film substrate 2, and the protruding parts 12c of the outer conductor 12 are situated on the power supply or grounding lines 6. Then, the connector is attached and fixed to the film substrate 2 by, for example, electrically joining the inner conductor 14 to the signal line 4 by soldering, and also electrically joining the protruding parts 12c of the outer conductor and portions contacting the power supply or grounding lines 6 to the power supply or grounding lines 6.

However, in the case of attaching the connector 10 to the film substrate 2 as shown in FIG. 1, the film substrate 2 is bent due to the weight of the connector 10 when the connector 10 is placed on the end portion of the film substrate 2 since the film substrate 2 is thin and flexible, and, thereby the connector 10 cannot be placed well. Accordingly, it is necessary to provide a jig to support the film substrate 2 from a backside thereof. Moreover, after carrying out soldering, the soldered portions are weak since merely the side surface of the outer conductor 12 and the side surfaces of the protruding parts 12c and the surfaces of the power supply or grounding lines 6 are joined by soldering, and, thus, reliable joining may not be assured.

Furthermore, if the signal line 4 is a line having an impedance of 50Ω, the width of the signal line 4 is smaller than the width of the inner conductor 14, and, thus, connecting position shift tends to occur. If such as position shift occurs, there is a problem in that a transmission characteristic is deteriorated particularly in a high-frequency application.

Thus, in the present embodiment, the coaxial connector is configured to have a structure with which the coaxial connector can be easily attached to the film substrate and the reliability of joining is improved. Additionally, the coaxial connecter is configured to permit accurate positioning being carried out simultaneously.

Figure 2A:
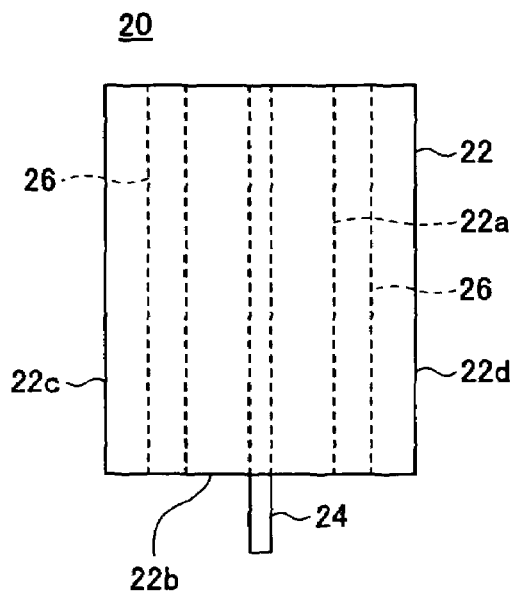
FIG. 2A is a plan view of a coaxial connector according to a first embodiment of the present invention.
Figure 2B:
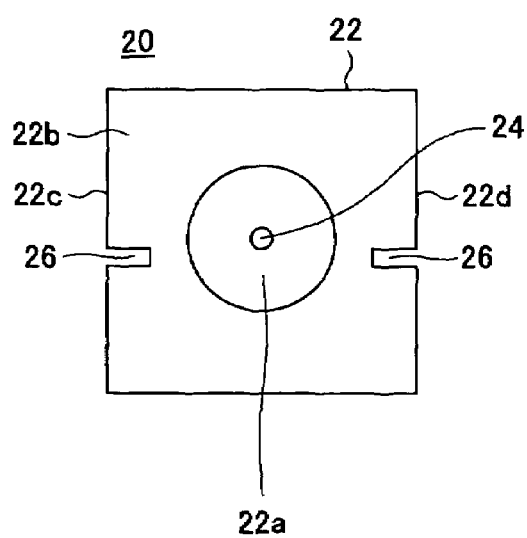
FIG. 2B is a front view of the coaxial connector shown in FIG. 2A.
Figure 2C:
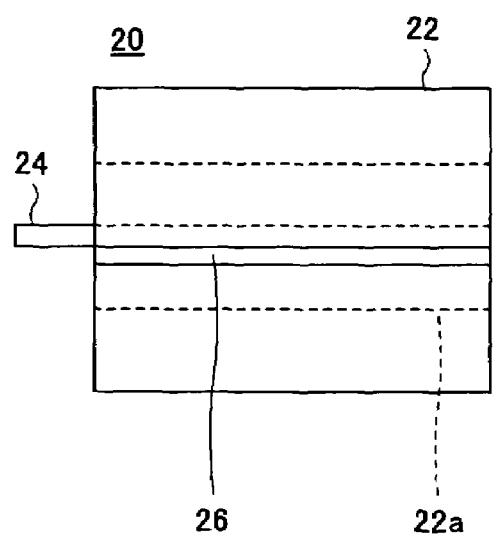
FIG. 2C is a side view of the coaxial connector shown in FIG. 2A.

FIG. 2A is a plan view of a coaxial connector 20 (hereinafter, referred to as a connector 20) according to a first embodiment of the present invention. FIG. 2B is a front view of the coaxial connector shown in FIG. 2A. FIG. 2C is a side view of the coaxial connector shown in FIG. 2A.

The connector 20 comprises an outer conductor 22 serving as a connector body and an inner conductor 24 serving as a signal line. The inner conductor 24 extends in a cylindrical centrum 22a in the center of the outer conductor 22. The inner conductor 24 protrudes from an end surface 22b of the outer conductor 22. The inner conductor 22 and the outer conductor 24 are formed of an electrically conductive material such as a copper alloy, and preferably applied with nickel-plating or gold-plating on the surfaces thereof. The nickel-plating and the gold-plating are applied to reduce a contact resistance and facilitate solder joining when being connected to wiring of a board (substrate).

In the present embodiment, a slit 26 is formed on each of the left and right side surfaces 22c and 22d of the outer conductor 22. Each slit 26 is a groove into which a flexible printed circuit board mentioned later is inserted, and has a width slightly larger than a thickness of the flexible printed circuit board. The slit 26 can be easily formed by cutting the left and right side surfaces 22c and 22d by a dicing blade or the like. It is preferable that nickel-plating and gold-plating are applied to inner surfaces of the slit 26.

Figure 3A:
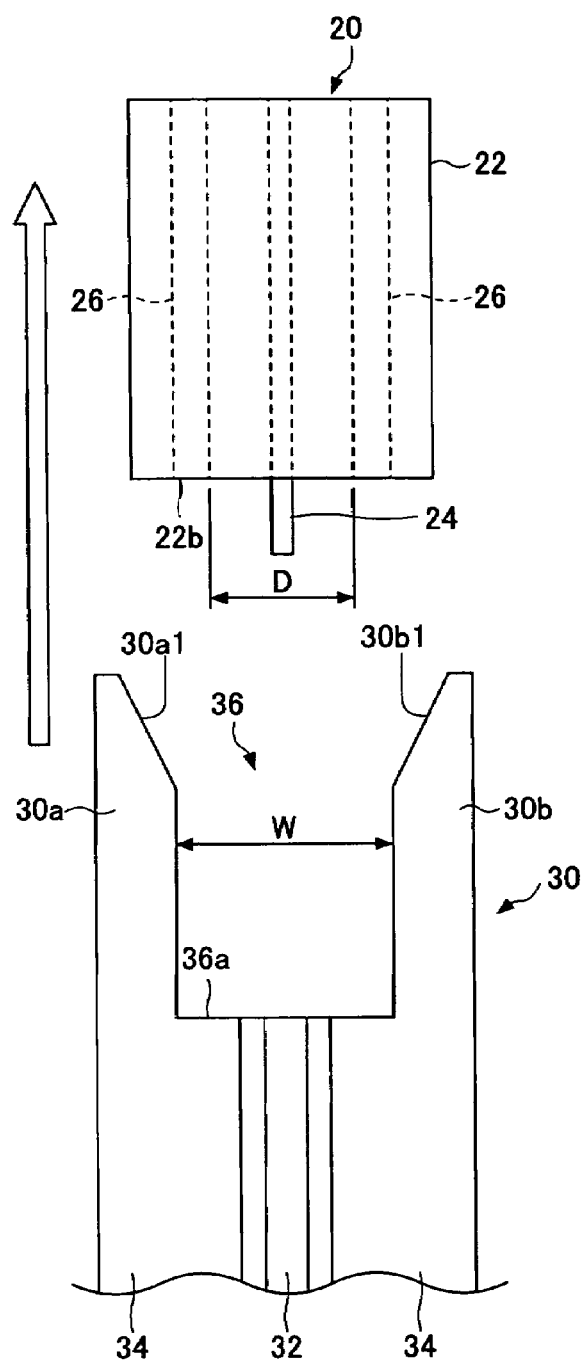
FIG. 3A is a plane view of the coaxial connector shown in FIG. 2A and a flexible printed circuit board to which the coaxial connector is connected.
Figure 3B:
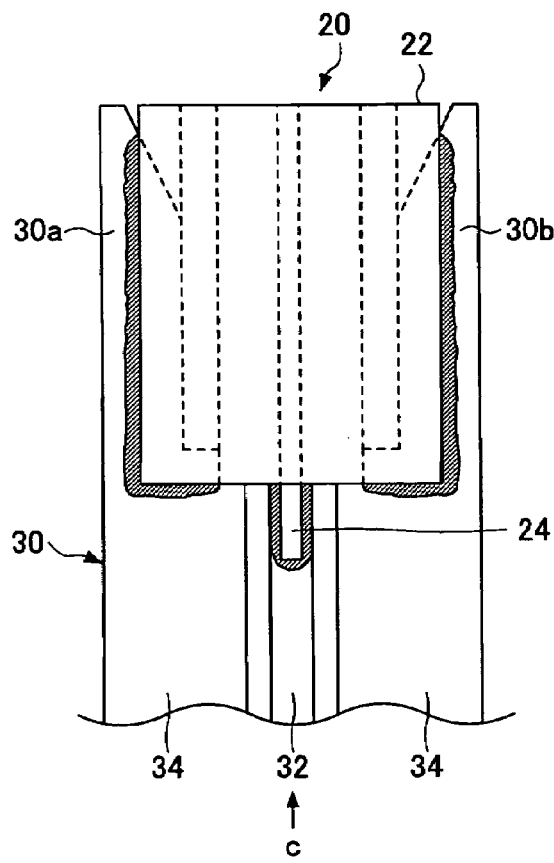
FIG. 3B is a plan view of the coaxial connector and the flexible printed circuit board in a state where the coaxial connecter is connected to the flexible printed circuit board.
Figure 3C:
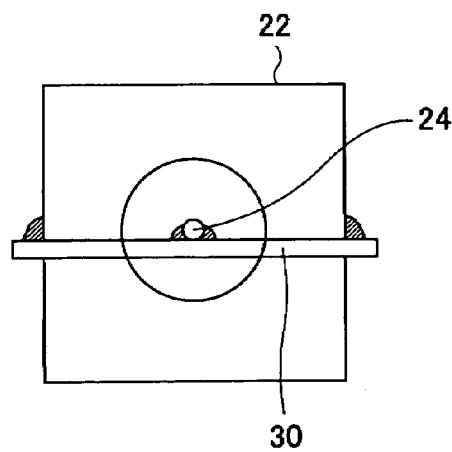
FIG. 3C is a front view of the coaxial connector in the state shown in FIG. 3B.

FIG. 3A is a plane view of the coaxial connector 20 shown in FIG. 2A and a flexible printed circuit board 30 to which the coaxial connector 20 is connected. FIG. 3B is a plan view of the coaxial connector 20 and the flexible printed circuit board 30 in a state where the coaxial connecter 20 is connected to the flexible printed circuit board 30. FIG. 3C is a front view of the coaxial connector 20 in the state shown in FIG. 3B, viewed from a direction indicated by an arrow C in FIG. 3B. A signal line 32 having a small width is formed on a surface of the flexible printed circuit board 30 (hereinafter, referred to as film substrate 30), and power supply or grounding lines 34 each having a large width are formed on both sides of the signal line 32. Power supply or grounding line may be provided on an entire back surface of the film substrate 30.

In order to connect the coaxial connector 20 (hereinafter, referred to as a connector 20) to the film substrate 30, first, as shown in FIG. 3A, a notch part 36 is positioned to face an end surface 22b of the connecter 20 and arrange the film substrate 30 and the connector 20 so that an inner conductor 24 of the connector 20 is aligned with the signal line 32 of the film substrate 30 and both side portions 30a and 30b of the notch part 30 are aligned with left and right slits 26, respectively.

Then, as shown in FIG. 3B, the film substrate 30 is moved in a direction toward the connector 20, and the both side portions 30a and 30b of the notch part 36 are inserted into the left and right slits 26 of the connector 20, respectively. Since taper parts 30a1 and 30b1, which incline with respect to the sides of the notch 36, are provided to the both side portions 30a and 30b, the both side portions 30a and 30b can be easily guided into the slits 26, respectively. The taper parts 30a1 and 30b1 can be straight, or may be curved with roundness.

A width of the notch part 36 is substantially equal to a distance D between the left and right slits 26 of the connector 20. Thus, when the both side portions 30a and 30b of the notch part 36 are inserted into the left and light slits 26 of the connector 20, the inner conductor 24 of the connector 20 and the signal line 32 of the film substrate 30 are automatically positioned with each other.

A state where a bottom 36a of the notch part 36 of the film substrate 30 is in contact with the end surface 22b of the connector 20 is shown in FIG. 3B. In this state, the both side portions 30a and 30b of the notch part 36 of the film substrate 30 are joined by soldering to the power supply or grounding lines 34, respectively. Although a solder is provided along openings of the slits 26 in a deposited state as indicated by hatched portions in FIGS. 3B and 3C, the melted solder enters inside the slits 26 so that inner surfaces of the slits 26 and the power supply or grounding lines 34 are joined by the solder, respectively. Accordingly, solder-joined portions are enlarged, which improves reliability of soldering and the connector 20 can be firmly fixed to the film substrate 30.

If a power supply or grounding line is provided on the back surface of the film substrate 30, the outer conductor 22 is solder-joined to the power supply or grounding line. Thereby, the solder joint can be made firm further. Additionally, simultaneously with the solder-joining of the outer conductor 22 to the power supply or grounding lines 34, the inner conductor 24 of the connector 20 is solder-joined to the signal line 32 of the film substrate 30.

The connector assembly comprising the thus-assembled connector 20 and the film substrate 30 can be easily connected to another printed circuit board by solder-joining an end portion opposite to the end portion where the connector 20 is connected to a connection line of the another printed circuit board.

Figure 4A:
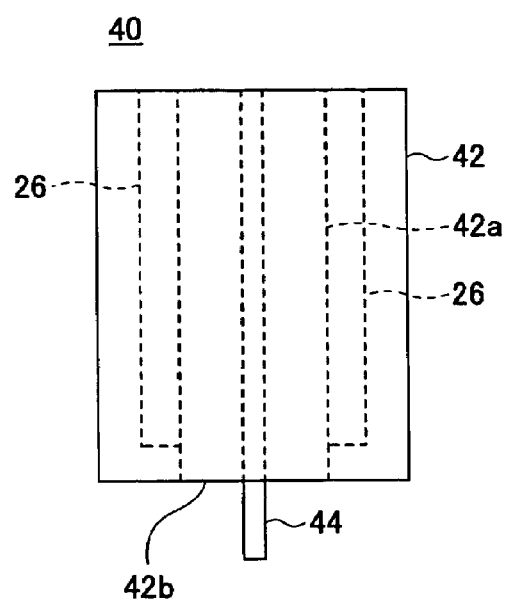
FIG. 4A is a plan view of a coaxial connector according to a second embodiment of the present invention.
Figure 4B:
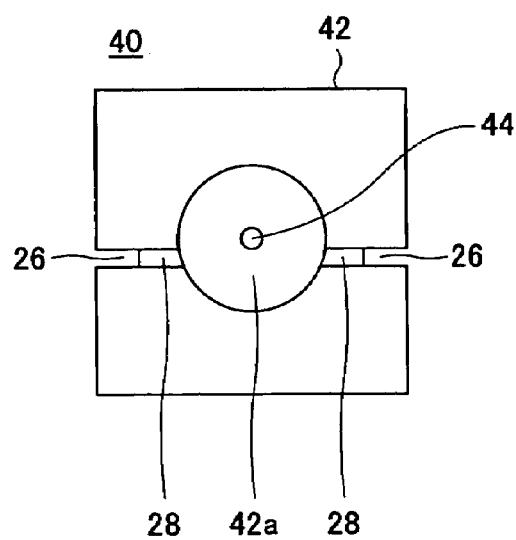
FIG. 4B is a front view of the coaxial connector shown in FIG. 4A.
Figure 4C:
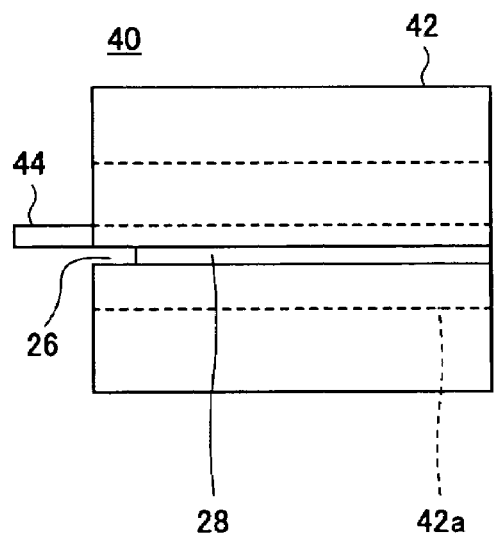
FIG. 4C is a side view of the coaxial connector shown in FIG. 4A.

A description will now be given, with reference to FIGS. 4A through 4C and FIGS. 5A through 5C, of a coaxial connector according to a second embodiment of the present invention. FIG. 4A is a plan view of a coaxial connector 40 (hereinafter, referred to as a connector 40) according to a second embodiment of the present invention. FIG. 4B is a front view of the connector 40 shown in FIG. 4A. FIG. 4C is a side view of the connector 40 shown in FIG. 4A. FIGS. 5A through 5C are views for explaining a process of connecting the connector 40 to a flexible printed circuit board 30. FIG. 5A is a plan view of the connector 40 and the flexible printed circuit board 30 before being connected with each other. FIG. 5B is a plan view of the connector 40 and the flexible printed circuit board 30 after being connected with each other. FIG. 5C is a front view of the connector 40 in the state shown in FIG. 5B, viewed from a direction indicated by an arrow C in FIG. 5B. In FIGS. 4A through 4C and FIGS. 5A through 5C, parts that are the same as the parts shown in FIGS. 2A through 2C and FIGS. 3A through 3C are given the same reference numerals, and descriptions thereof will be omitted.

Although the connector 40 has the same structure as the above-mentioned connector 20, there is a difference in that a slit 28 is provided on an end surface 42b of an outer conductor 42. Similar to the slit 26, the slit 28 is a groove formed so that a portion of the film substrate 30 is inserted therein. Specifically, a bottom portion 36a of the notch part 36 of the film substrate 30 is inserted into the slit 28. Therefore, according to the present embodiment, the bottom portion 36a of the notch part 36 of the film substrate 30 is solder-joined and fixed to the outer conductor 42 of the connector 40. Thus, the reliability of the solder-joint is improved and the connector 40 can be firmly fixed to the film substrate 30.

A method of connecting the connector 40 and the film substrate 30 is the same as the above-mentioned method of connecting the connector 20 and the film substrate 30, and a description thereof will be omitted.

Figure 6A:
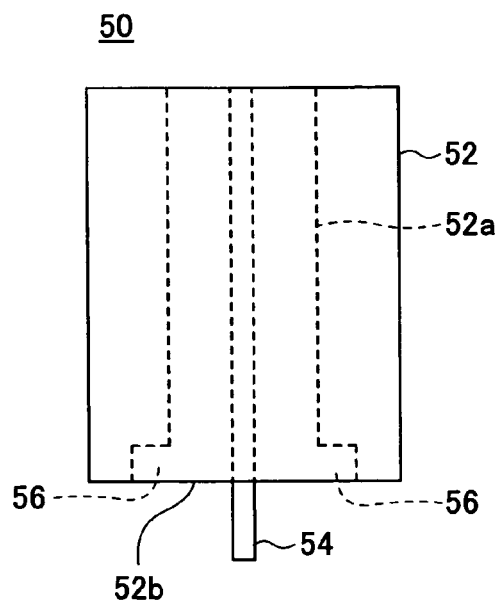
FIG. 6A is a plan view of a coaxial connector according to a third embodiment of the present invention.
Figure 6B:
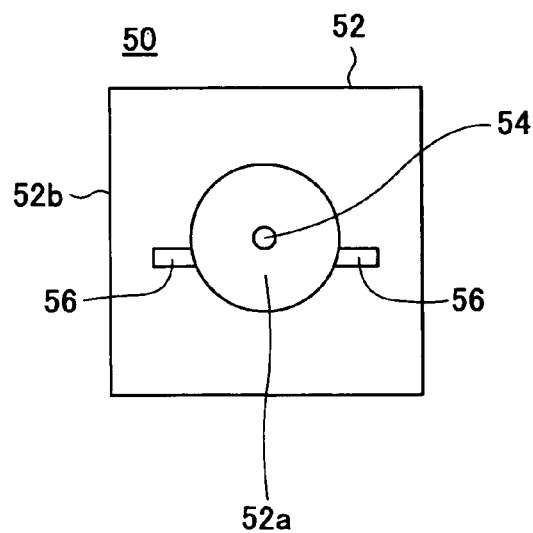
FIG. 6B is a front view of the coaxial connector shown in FIG. 6A.
Figure 6C:
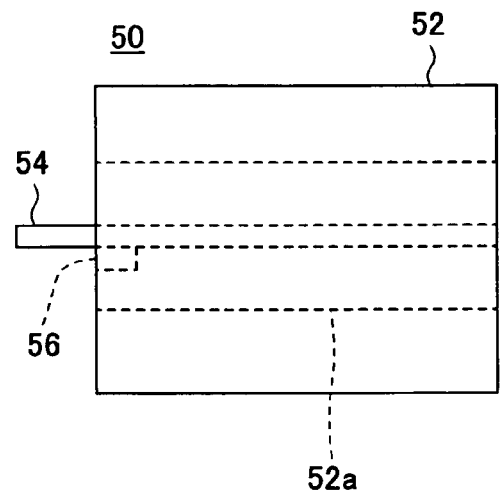
FIG. 6C is a side view of the coaxial connector shown in FIG. 6A.
Figure 7A:
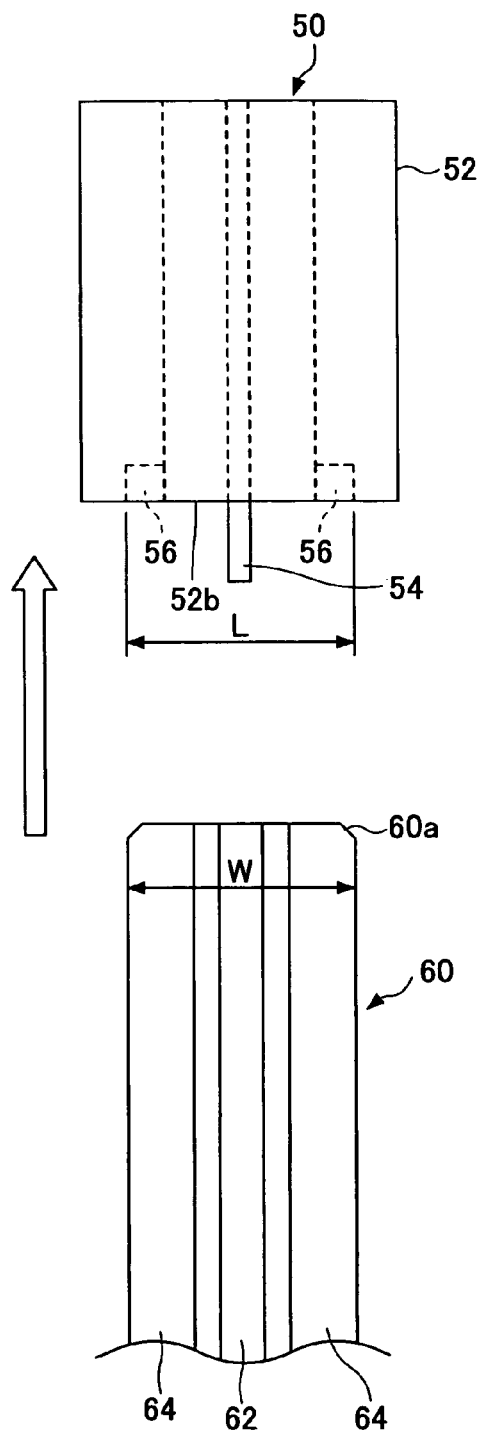
FIG. 7A is a plane view of the coaxial connector shown in FIG. 6A and a flexible printed circuit board to which the coaxial connector is connected.
Figure 7B:
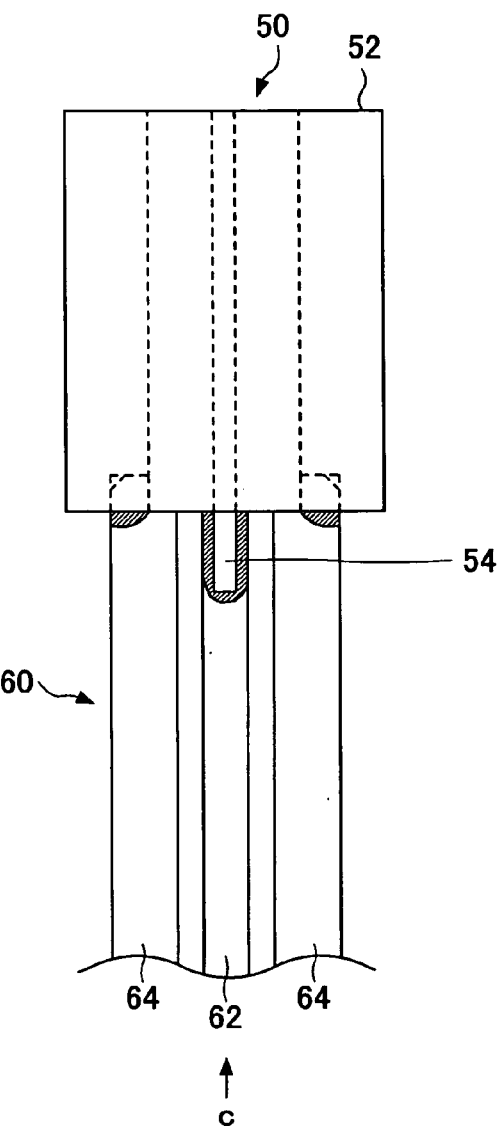
FIG. 7B is a plan view of the coaxial connector and the flexible printed circuit board in a state where the coaxial connecter is connected to the flexible printed circuit board.
Figure 7C:
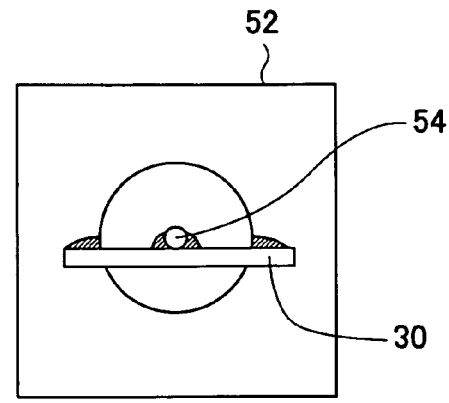
FIG. 7C is a front view of the coaxial connector in the state shown in FIG. 7B.

A description will now be given, with reference to FIGS. 6A through 6C and FIGS. 7A through 7C, of a coaxial connector according to a third embodiment of the present invention. FIG. 6A is a plan view of a coaxial connector 50 (hereinafter, referred to as a connector 50) according to a third embodiment of the present invention. FIG. 6B is a front view of the connector 50 shown in FIG. 6A. FIG. 5C is a side view of the connector 40 shown in FIG. 6A. FIGS. 7A through 7C are views for explaining a process of connecting the connector 50 to a flexible printed circuit board 60. FIG. 5A is a plan view of the connector 50 and the flexible printed circuit board 60 before being connected with each other. FIG. 7B is a plan view of the connector 50 and the flexible printed circuit board 60 after being connected with each other. FIG. 7C is a front view of the connector 50 in the state shown in FIG. 7B, viewed from a direction indicated by an arrow C in FIG. 5B.

The connector 50 comprises an outer conductor 52 serving as a connector body and an inner conductor 54 serving as a signal line. The inner conductor 54 extends in a cylindrical centrum 52a in the center of the outer conductor 52. The inner conductor 54 protrudes from an end surface 52b of the outer conductor 52. The inner conductor 52 and the outer conductor 54 are formed of an electrically conductive material such as a copper alloy, and preferably applied with nickel-plating and gold-plating on the surfaces thereof. The nickel-plating and the gold-plating are applied to reduce a contact resistance and facilitate solder joining when being connected to wiring of a board (substrate).

In the present embodiment, a slit 56 is formed on an end surface 52b of the outer conductor 52. The slit 56 is a groove into which the flexible printed circuit board 60 is inserted, and has a thickness slightly larger than a thickness of the flexible printed circuit board 60. Inner surfaces of the slit 56 are preferably applied with nickel-plating and gold-printing.

As shown n FIG. 7A, a signal line 62 having a small width is formed on a surface of the flexible printed circuit board 60 (hereinafter, referred to as a film substrate 60), and power supply or grounding lines 64 each having a large width are formed on both sides of the signal line 62. Power supply or grounding line may be provided on an entire back surface of the film substrate 60.

In order to connect the coaxial connector 50 to the film substrate 60, first, as shown in FIG. 7A, an end portion of the film substrate 60 is positioned to face an end surface 52b of the connecter 50 and the film substrate 60 and the connector 50 are arranged so that the inner conductor 54 of the connector 50 is aligned with the signal line 52 of the film substrate 60 and the film substrate 60 is aligned with the slit 56.

Then, as shown in FIG. 7B, the film substrate 60 is moved in a direction toward the connector 50, and the end portion of the film substrate 60 is inserted into the slit 56. Since taper parts 60a are provided to both sides of the film substrate 60, the both side portions of the film substrate 60 can be easily guided into the slit 56. The taper parts 60a can be straight, or may be curved with roundness.

A width W of the film substrate 60 is substantially equal to a length L of the connector 50. When the end portion of the film substrate 60 is inserted into the slit 56 of the connector 50, the inner conductor 54 of the connector 50 and the signal line 62 of the film substrate 60 are automatically positioned to each other.

A state where the end portion of the film substrate 60 is in contact with a bottom of the slit 56 is shown in FIG. 7B. In this state, the outer conductor 52 of the connector 50 is solder-joined to the power supply or grounding lines 64 of the film substrate 60. Although a solder is provided along openings of the slit 56 in a deposited state as indicated by hatched portions in FIGS. 7B and 7C, the melted solder enters inside the slit 56 so that inner surfaces of the slit 56 and the power supply or grounding lines 64 are solder-joined. Accordingly, solder-joined portions are enlarged, which improves reliability of soldering and the connector 50 can be firmly fixed to the film substrate 60.

If a power supply or grounding line is provided on the back surface of the film substrate 60, the outer conductor 52 is solder-joined to the power supply or grounding line. Thereby, the solder joint can be made firm further. Additionally, simultaneously with the solder-joining of the outer conductor 52 to the power supply or grounding lines 64, the inner conductor 54 of the connector 50 is solder-joined to the signal line 62 of the film substrate 60.

The connector assembly comprising the thus-assembled connector 50 and the film substrate 60 can be easily connected to another printed circuit board by solder-joining an end portion opposite to the end portion where the connector 50 is connected to a connection line of the another printed circuit board.

Figure 8A:
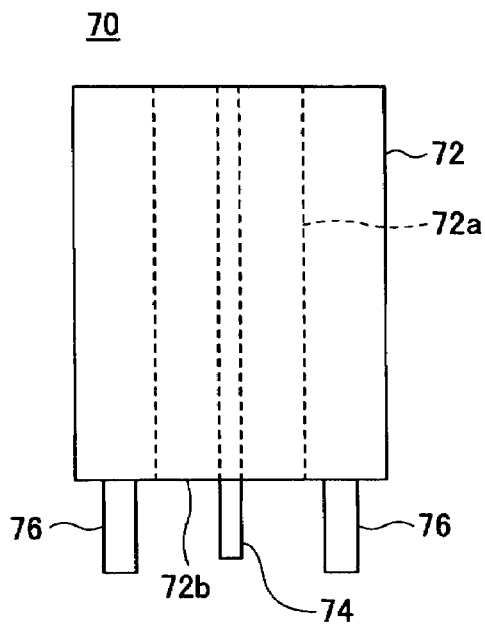
FIG. 8A is a plan view of a coaxial connector according to a fourth embodiment of the present invention.
Figure 8B:
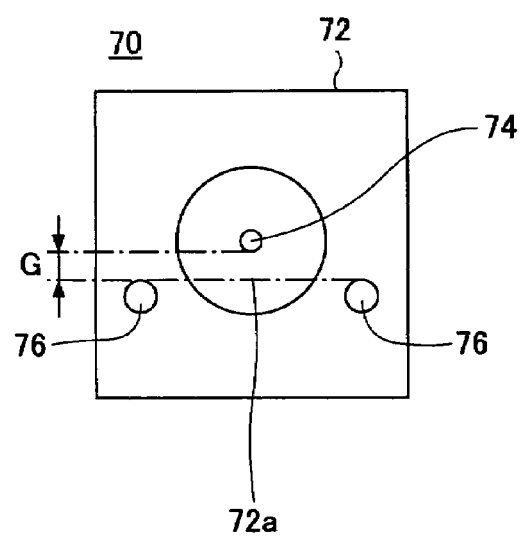
FIG. 8B is a front view of the coaxial connector shown in FIG. 8A.
Figure 8C:
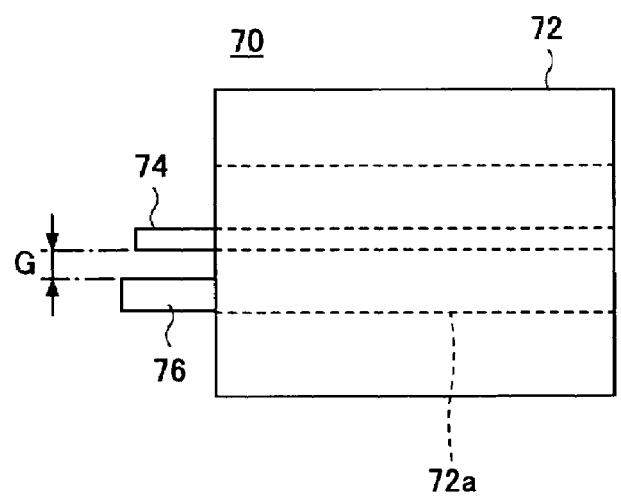
FIG. 8C is a side view of the coaxial connector shown in FIG. 8A.
Figure 9A:
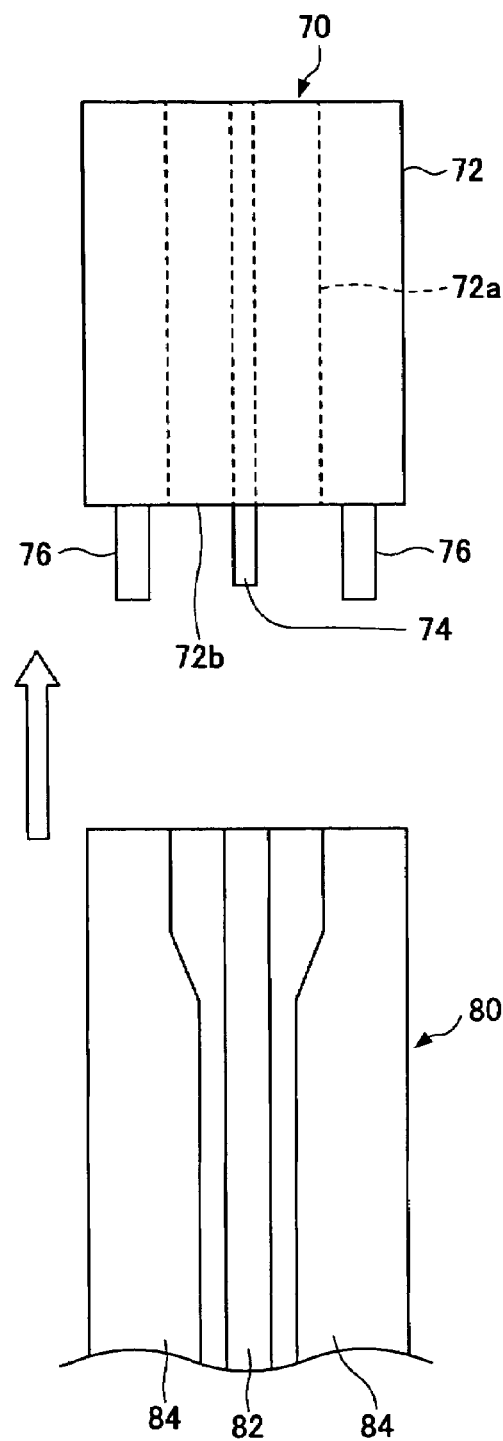
FIG. 9A is a plane view of the coaxial connector shown in FIG. 8A and a flexible printed circuit board to which the coaxial connector is connected.
Figure 9B:
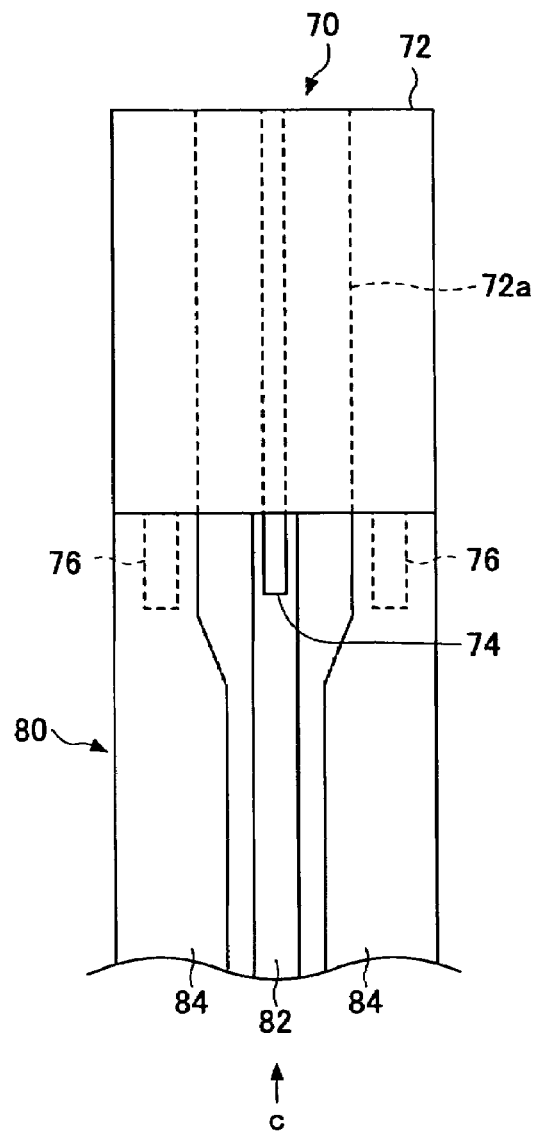
FIG. 9B is a plan view of the coaxial connector and the flexible printed circuit board in a state where the coaxial connecter is connected to the flexible printed circuit board.
Figure 9C:
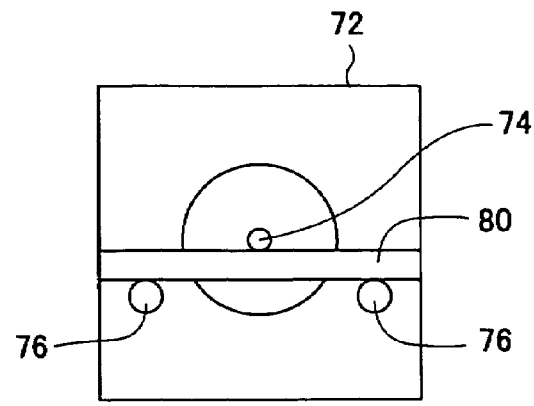
FIG. 9C is a front view of the coaxial connector in the state shown in FIG. 9B.

A description will now be given, with reference to FIGS. 8A through 8C and FIGS. 9A through 9C, of a coaxial connector according to a fourth embodiment of the present invention. FIG. 8A is a plan view of a coaxial connector 70 (hereinafter, referred to as a connector 70) according to the fourth embodiment of the present invention. FIG. 8B is a front view of the connector 70 shown in FIG. 8A. FIG. 8C is a side view of the connector 70 shown in FIG. 8A. FIGS. 9A through 9C are views for explaining a process of connecting the connector 70 to a flexible printed circuit board 80. FIG. 9A is a plan view of the connector 70 and the flexible printed circuit board 80 before being connected with each other. FIG. 9B is a plan view of the connector 70 and the flexible printed circuit board 80 after being connected with each other. FIG. 9C is a front view of the connector 70 in the state shown in FIG. 9B, viewed from a direction indicated by an arrow C in FIG. 9B.

The connector 70 comprises an outer conductor 72 serving as a connector body and an inner conductor 74 serving as a signal line. The inner conductor 74 extends in a cylindrical centrum 72a in the center of the outer conductor 72. The inner conductor 74 protrudes from an end surface 72b of the outer conductor 72. The inner conductor 72 and the outer conductor 74 are formed of an electrically conductive material such as a copper alloy, and preferably applied with nickel-plating and gold-plating on the surfaces thereof. The nickel-plating and the gold-plating are applied to reduce a contact resistance and facilitate solder joining when being connected to wiring of a board (substrate).

In the present embodiment, two pins 76 protrude and extend from the end surface 72b of the outer conductor 72. The two pins 76 are positioned so that a gap G is formed between the inner conductor 74 and the two pins 76, when viewed from a side as shown in FIGS. 8B and 8C, so that the flexible printed circuit board 80 is inserted into the gap G. A width of the gap G is preferably within a tolerance in dimension of a thickness of the flexible printed circuit board 80 to be inserted.

As shown n FIG. 9A, a signal line 82 having a small width is formed on a surface of the flexible printed circuit board 80 (hereinafter, referred to as a film substrate 80), and power supply or grounding lines 84 each having a large width are formed on both sides of the signal line 82. Power supply or grounding line may be provided on an entire back surface of the film substrate 80.

In order to connect the connector 70 to the film substrate 80, first, as shown in FIG. 9A, an end portion of the film substrate 80 is positioned to face an end surface 72b of the connecter 70 and the film substrate 80 and the connector 70 are arranged so that the inner conductor 74 of the connector 70 is aligned with the signal line 82 of the film substrate 80 and the film substrate 80 is aligned with the gap G between the inner conductor 74 and the pins 76.

Then, as shown in FIG. 9B, the film substrate 80 is moved in a direction toward the connector 70, and the end portion of the film substrate 80 is inserted into the gap G between the inner conductor 74 and the pins 76.

A state where the end portion of the film substrate 80 is in contact with the end surface 72b of the film substrate 80. The film substrate 80 is supported by being sandwiched between the inner conductor 74 and the pins 76. In this state, the outer conductor 72 of the connector 70 is solder-joined to the power supply or grounding lines 84 of the film substrate 80. A solder is provided along the end surface 72b in a deposited state as indicated by hatched portions in FIGS. 9B and 9C. If a power supply or grounding line is provided on the back surface of the film substrate 80, the outer conductor 72 is solder-joined to the power supply or grounding line. Thereby, the solder joint can be made firm further. Additionally, simultaneously with the solder-joining of the outer conductor 72 to the power supply or grounding lines 84, the inner conductor 84 of the connector 70 is solder-joined to the signal line 82 of the film substrate 80.

The connector assembly comprising the thus-assembled connector 70 and the film substrate 80 can be easily connected to another printed circuit board by solder-joining an end portion opposite to the end portion where the connector 70 is connected to a connection line of the another printed circuit board.

It should be noted that if the above-mentioned structure to support the film substrate 80 by the pins 76 is applied to the above-mentioned first through third embodiments in which the film substrate is supported by the slit, the support of the film substrate can be assured further.

The connector assembly configured by connecting the connector of one of the first to fourth embodiments to the flexible printed circuit board can be used as a circuit part of electronic equipments that performs signal transmission.

Figure 10:
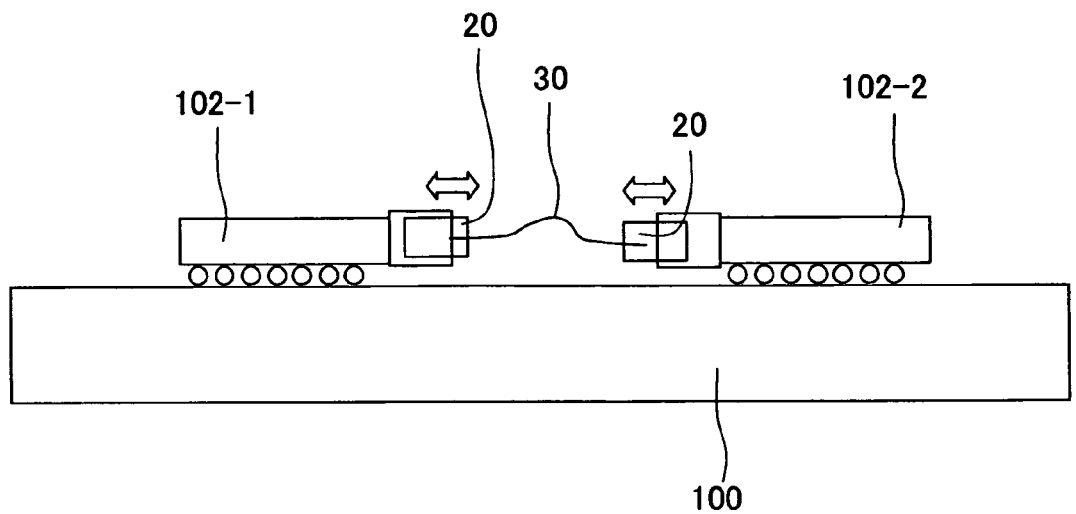
FIG. 10 is an illustration showing an example of using a connector assembly according to the present invention in an application of connecting a device to another device.

FIG. 10 is an illustration of an example using the connector assembly according to the present invention in an application where a device such as a semiconductor device and another device are connected to each other. In FIG. 10, the connectors 20 are connected to the both ends of the film substrate 30 in the connector assembly shown in FIG. 3B. The connectors 20 on both ends are connected to devices 102-1 and 102-2 mounted on a circuit board 100, respectively. Even if a distance between the devices 102-1 and 102-2 is small, a position shift in the devices 102-1 and 102-2 can be absorbed by the film substrate 30 being curved.

Figure 11:
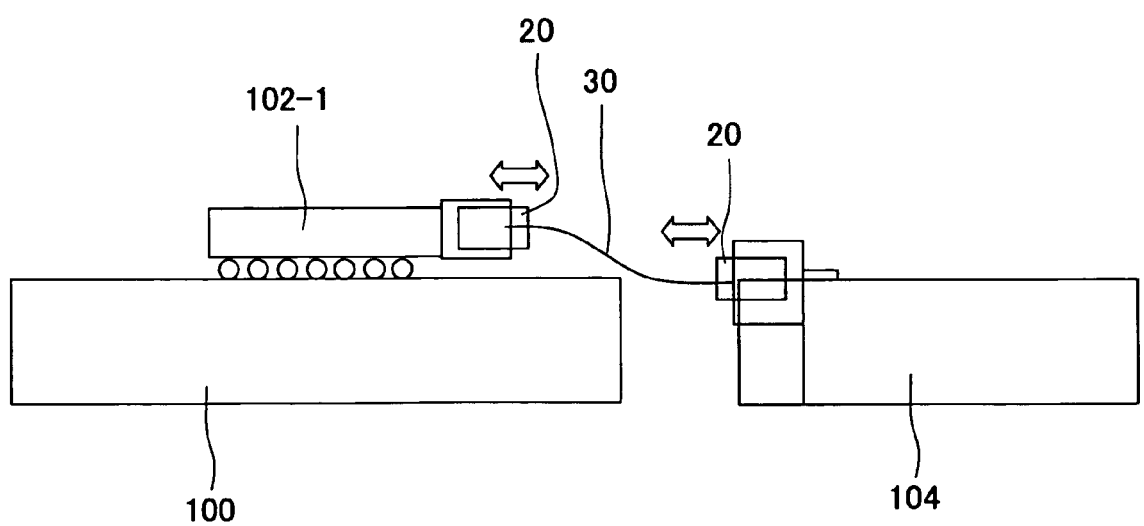
FIG. 11 is an illustration showing an example of using a connector assembly according to the present invention in an application of connecting a device to a board.

FIG. 11 is an illustration of an example using the connector assembly according to the present invention in an application where a device such as a semiconductor device is connected to a circuit board. In FIG. 11, the connectors 20 are connected to the both ends of the film substrate 30 in the connector assembly shown in FIG. 3B. The connectors 20 on both ends are connected to the device 102-1 mounted on the circuit board 100 and another circuit board 104, respectively. Even if the positions of the device 102-1 and the circuit board 104 are shifted vertically to each other, the device 102-1 and the circuit board 104 can be easily connected according to the film substrate 30 being curved.

Figure 12:
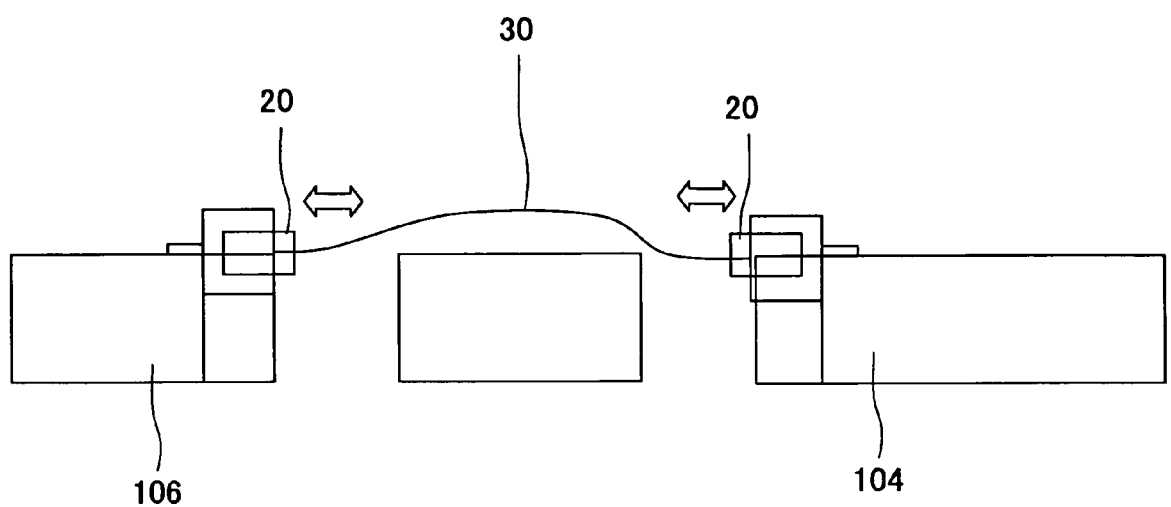
FIG. 12 is an illustration showing an example of using a connector assembly according to the present invention in an application of connecting a board to another board.

FIG. 12 is an illustration of an example using the connector assembly according to the present invention in an application where a circuit board and another circuit board are connected to each other. In FIG. 12, the connectors 20 are connected to the both ends of the film substrate 30 in the connector assembly shown in FIG. 3B. The connectors 20 on both ends are connected to the circuit board 104 and another circuit board 106, respectively. Even if there is an obstacle between the circuit boards 104 and 106, the circuit boards 104 and 106 are easily connected to each other while avoiding the obstacle by the film substrate being curved.

It should be noted that although the connectors 20 according to the first embodiment are used in the examples shown in FIG. 10 through FIG. 12, connectors according to the second through fourth embodiment may be used.

A description will now be given, with reference to FIGS. 13A through 13C, of a coaxial connector according to a fifth embodiment of the present invention. FIG. 13A is a plan view of a coaxial connector.120 (hereinafter, referred to as a connector 120) according to the fifth embodiment of the present invention. FIG. 13B is a front view of the connector 120 shown in FIG. 13A. FIG. 13C is a side view of the connector 120 shown in FIG. 13A.

The connector 120 is a multi-conductor connector formed by connecting three pieces of the connector 20 shown in FIG. 2A. That is, three pieces of the connector 20 shown in FIG. 2A are aligned and integrated with each other by driving wedges 122 into the opposing slits 26 of the adjacent connectors 20. It is preferable that the wedges 122 are driven into the slits 26 to a position where the ends of the wedges 122 are recessed by a distance of about 0.5 to 1 mm from the outer conductors 22 so that the ends of the wedges 122 do not protrude from the outer conductors 22.

According to the present embodiment, a multi-conductor connector can be easily constructed by merely driving the wedges 122 into the slits 26. A number of pieces of the connector 20 to be connected is not limited to three, and an arbitrary number of pieces of the connectors can be connected.

The connector 120 can be connected to a flexible printed circuit board having three signal lines formed thereon using the same method as the method of connecting the connector and the flexible printed circuit board according to the above-mentioned first through fourth embodiments. For example, what is necessary to achieve the connection shown in FIG. 3B is to form three signal lines on the flexible printed circuit board and setting the width of the notch part to be substantially equal to a distance between bottoms of the slits 26 on the connectors 120 on opposite sides.

A description will now be given of an example of a printed circuit board using the connectors according to one of the above-mentioned embodiments and an example of an electronic apparatus using such a printed circuit board.

Figure 14:
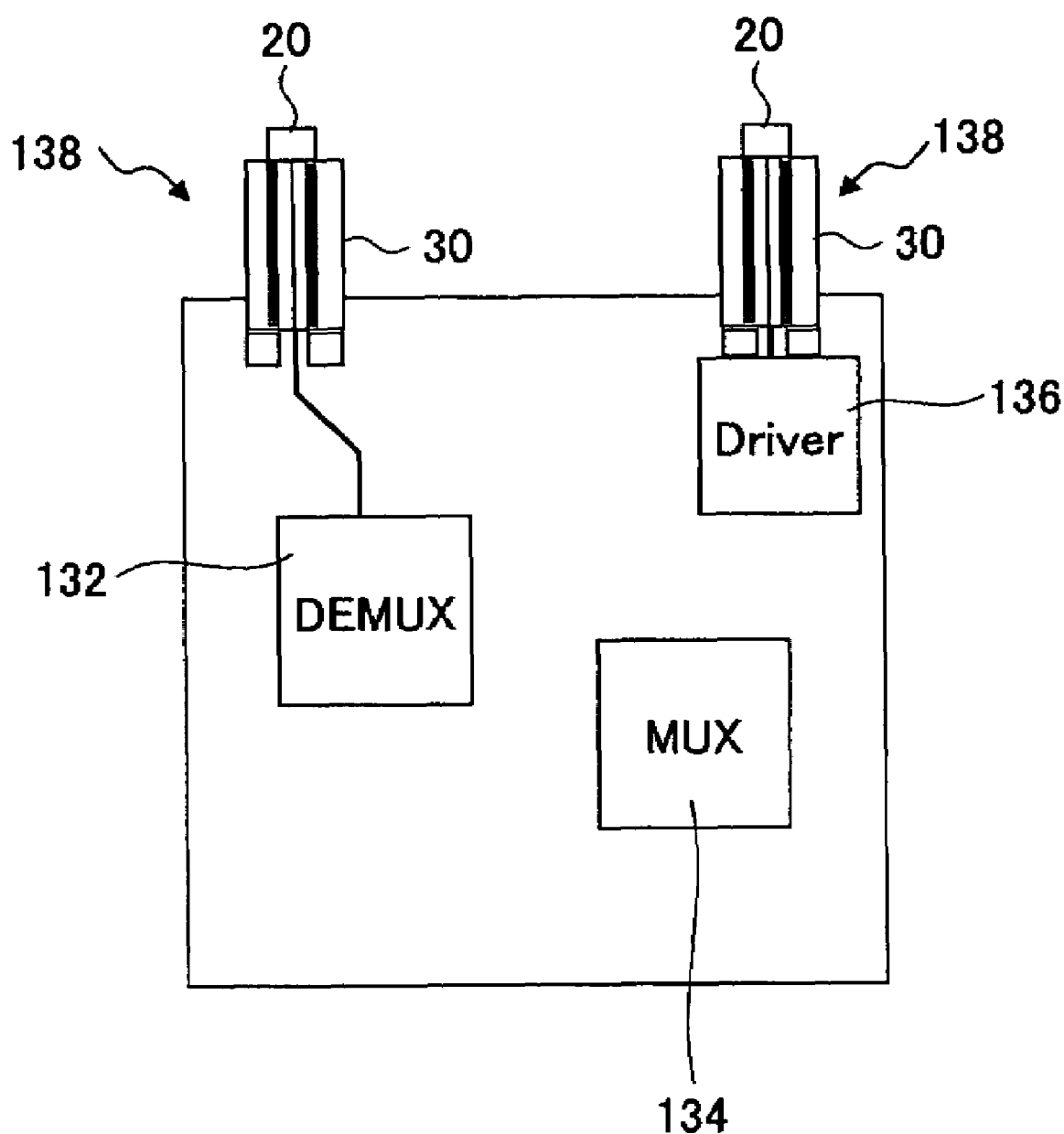
FIG. 14 is an illustrative plan view of a printed bard provided with a connector assembly having a coaxial connector according to the present invention.

FIG. 14 is an illustrative plan view of a printed circuit board provided with a connector assembly having the coaxial connectors according to the present invention. In FIG. 14, the printed circuit board 130 is a circuit board constituting a signal processing circuit of an optical transceiver. Mounted on the printed circuit board 130 are a demultiplexer (DE-MUX) 132, a multiplexer (MUX) 134, a driver (Driver) 136, etc., for processing signals. A connector assembly 138 according to the present invention is, for example, the connector assembly shown in FIG. 3B in which the connector 20 is connected to one end of the flexible printed circuit board 30 and the other end of the flexible printed circuit board 30 is connected to a pattern circuit of the printed circuit board 130 by solder-joining or the like. It should be noted that the connector assembly is not limited to that shown in FIG. 3B, and any one of the connector assemblies according to the above-mentioned embodiments may be used.

Figure 15:
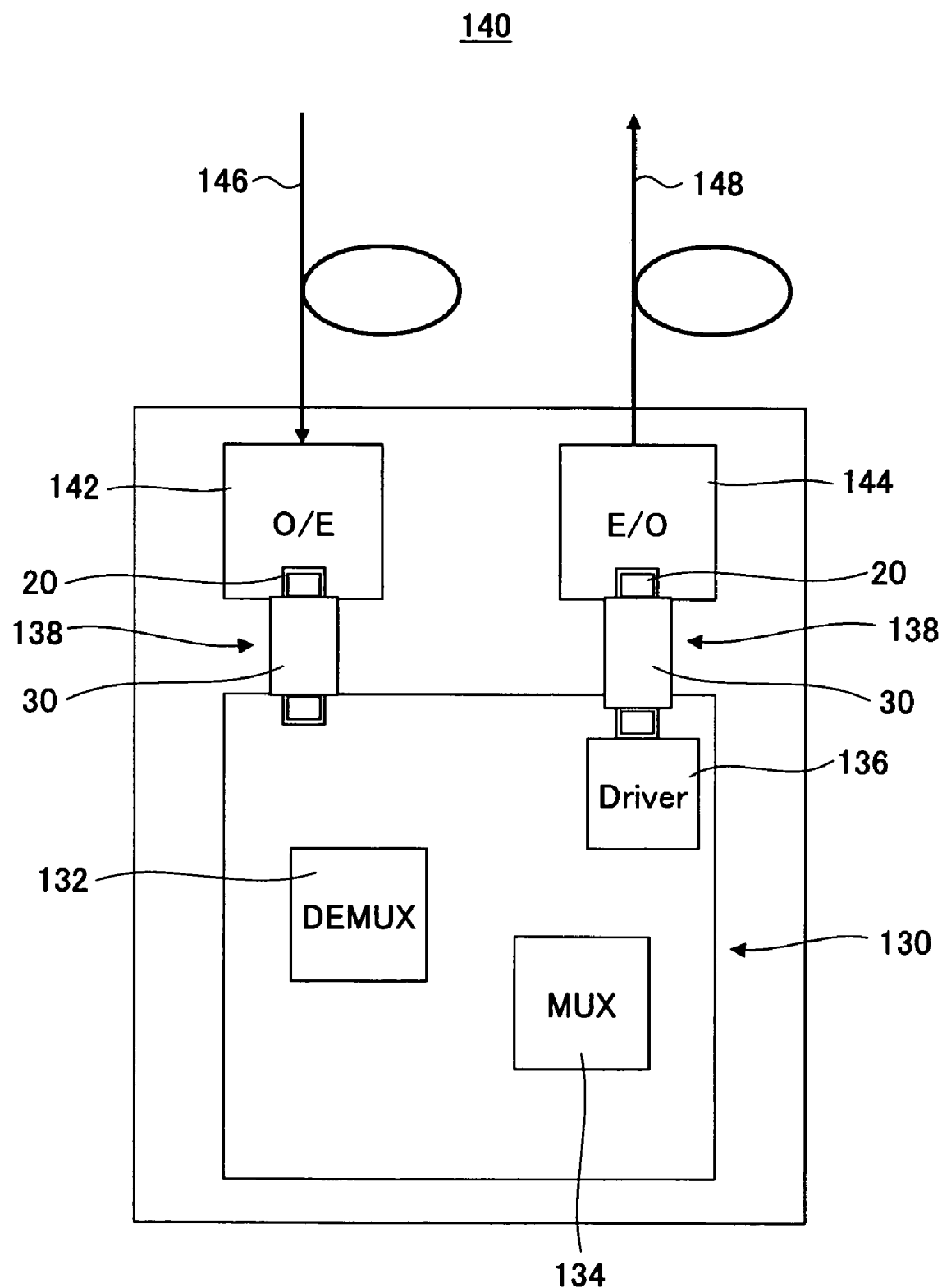
FIG. 15 is an illustrative plan view of an optical transceiver which is an electronic apparatus having the printed board shown in FIG. 14.

FIG. 15 is an illustrative plan view of an optical transceiver 140 as an electronic apparatus having the printed circuit board 130 shown in FIG. 14. In FIG. 15, an optical-electric transducer (O/E) 142 is connected to one of the connectors 20 of the connector assembly 138. An electro-optical transducer (E/O) 144 is connected to the other one of the connectors 20 of the connector assembly 138. An optical signal 142 input from an optical cable 146 to the optical-electric transducer (O/E) 142 is converted into an electric signal by the optical-electric transducer (O/E) 142, and is transmitted to the printed circuit board 130 via the connector 20 and the flexible printed circuit board 30. The electric signal is processed by the demultiplexer (DEMUX) 132, the multiplexer (MUX) 134, the driver (Driver) 136, etc., and is input to the electro-optical transducer (E/O) 144 via the flexible printed circuit board 30 and the connector 20. The electric signal is converted into an optical signal in the electro-optical transducer (E/O) 144, and output through an optical cable 148.

In the above-mentioned optical transceiver, even if distances between the printed circuit board 130 and each of the optical-electric transducer (O/E) 142 and the electro-optical transducer (E/O) 144 are small, they can be easily connected to each other since the flexible printed circuit boards 30 of the connector assemblies 138 can be curved by a small bending radius. Accordingly, the packaging density of parts of the optical transducer can be improved, which achieves a smaller optical transceiver.

It should be noted that although the description was given of the example in which the present invention is applied to a plug side (male side) of the coaxial connector, the present invention is applicable also to a jack side (female side).

The present invention is not limited to the specifically disclosed embodiments, and variations and modifications may be made without departing from the scope of the present invention.

The present application is based on priority Japanese application No. 2006-135043 filed May 15, 2006, the entire contents of which are hereby incorporated herein by reference.

What is claimed is:

1. A coaxial connector configured to be connected to a flexible printed circuit board on which a signal line is formed, the coaxial connector, comprising:
   an inner conductor configured to be connected to the signal line;
   an outer conductor surrounding the inner conductor and serving as a connector body; and
   at least one slit provided to the outer conductor so that a portion of said flexible printed circuit board is inserted therein, the at least one slit having an inner surface extending in a direction of insertion of the flexible printed circuit board, which is brought in contact with a side edge surface of the flexible printed circuit board.

2. The coaxial connector as claimed in claim 1, wherein said slit is provided to a side surface of said outer conductor.

3. The coaxial connector as claimed in claim 1, wherein said slit is provided to an end surface of said outer conductor from which said inner conductor extends.

4. The coaxial connector as claimed in claim 1, wherein a width of said slit is substantially equal to a thickness of said flexible printed circuit board.

5. A connector assembly comprising:
   a coaxial connector as claimed in claim 1; and
   a flexible printed circuit board,
   wherein the flexible printed circuit board has a notch part on an end portion connected to said coaxial connector so that an edge of the notch part is inserted into said slit of said outer conductor of said coaxial connector so that said flexible printed circuit board and said coaxial connector are electrically connected to each other.

6. The connector assembly as claimed in claim 5, wherein opposite side portions of said notch part are inserted into said slits formed on both side surfaces of said outer conductor, respectively, and the side portions are electrically connected to said outer conductor.

7. The connector assembly as claimed in claim 6, a tapered portion is provided at an end of each of said opposite side portions of said notch part.

8. The connector assembly as claimed in claim 5, wherein a bottom portion of said notch part is inserted into said slit formed on an end surface of said outer conductor so that said flexible printed circuit board and said coaxial connector are electrically connected to each other.

9. A printed circuit board comprising:
   a connector assembly as claimed in claim 5; and
   a circuit board connected with said flexible printed circuit board of said connector assembly.

10. An electronic apparatus comprising:
    a printed circuit board as claimed in claim 9.

* * * * *